United States Patent
Kim et al.

(10) Patent No.: US 10,847,474 B2
(45) Date of Patent: Nov. 24, 2020

(54) SEMICONDUCTOR PACKAGE AND ELECTROMAGNETIC INTERFERENCE SHIELDING STRUCTURE FOR THE SAME

(71) Applicant: SAMSUNG ELECTRONICS CO., LTD., Suwon-si (KR)

(72) Inventors: Woon Chun Kim, Suwon-si (KR); Jun Heyoung Park, Suwon-si (KR); Ji Hye Shim, Suwon-si (KR); Sung Keun Park, Suwon-si (KR); Gun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/403,968

(22) Filed: May 6, 2019

(65) Prior Publication Data
US 2020/0152580 A1   May 14, 2020

(30) Foreign Application Priority Data

Nov. 9, 2018 (KR) .......................... 10-2018-0137197

(51) Int. Cl.
| H01L 23/552 | (2006.01) |
| H01L 23/31  | (2006.01) |
| H01L 23/538 | (2006.01) |
| H01L 23/00  | (2006.01) |

(52) U.S. Cl.
CPC ........ *H01L 23/552* (2013.01); *H01L 23/3128* (2013.01); *H01L 23/5383* (2013.01); *H01L 23/5386* (2013.01); *H01L 23/5389* (2013.01); *H01L 24/20* (2013.01); *H01L 2224/214* (2013.01); *H01L 2924/3025* (2013.01)

(58) Field of Classification Search
CPC ............... H01L 23/552; H01L 23/5383; H01L 23/5386; H01L 23/5389; H01L 23/3128; H01L 24/20; H01L 2225/06537; H01L 2924/3025
See application file for complete search history.

(56) References Cited

U.S. PATENT DOCUMENTS

| 9,984,983 B2 | 5/2018 | Chung et al. |
| 2010/0200407 A1* | 8/2010 | Garbar .................... C25D 5/00 205/50 |

(Continued)

FOREIGN PATENT DOCUMENTS

KR   10-2008-0031730 A1   4/2008

*Primary Examiner* — Matthew E. Gordon
(74) *Attorney, Agent, or Firm* — Sughrue Mion, PLLC

(57) ABSTRACT

A semiconductor package includes a connection structure including one or more redistribution layers, a semiconductor chip disposed on the connection structure and electrically connected to the one or more redistribution layers, an encapsulant disposed on the connection structure and covering at least a portion of the semiconductor chip, and a shielding structure covering at least a portion of the encapsulant. The shielding structure includes a conductive pattern layer having a plurality of openings, a first metal layer covering the conductive pattern layer and extending across the plurality of openings, and a second metal layer covering the first metal layer. The second metal layer has a thickness greater than a thickness of the first metal layer.

18 Claims, 13 Drawing Sheets

(56) References Cited

U.S. PATENT DOCUMENTS

| 2016/0118337 | A1* | 4/2016 | Yoon | H01L 24/20 |
| | | | | 257/753 |
| 2017/0295643 | A1* | 10/2017 | Suzuki | H05K 1/115 |
| 2019/0333883 | A1* | 10/2019 | Chiang | H01L 23/66 |
| 2020/0075503 | A1* | 3/2020 | Chuang | H01L 23/5389 |

* cited by examiner

SEMICONDUCTOR PACKAGE AND ELECTROMAGNETIC INTERFERENCE SHIELDING STRUCTURE FOR THE SAME

CROSS-REFERENCE TO RELATED APPLICATION(S)

This application claims benefit of priority to Korean Patent Application No. 10-2018-0137197 filed on Nov. 9, 2018 in the Korean Intellectual Property Office, the disclosure of which is incorporated herein by reference in its entirety.

BACKGROUND

The present disclosure relates to a semiconductor package and an electromagnetic interference shielding structure for electromagnetic interference shielding of the semiconductor package.

Semiconductor packages are becoming smaller and thinner as users demand slim, high-end devices to provide users with improved gripping characteristics and improved designs. As electromagnetic waves generated by such components cause interference with other components in close proximity thereto, malfunctions may occur. To address the issue, electromagnetic interference (EMI) shielding technology has been more actively developed.

According to a shielding technique employed in recent years, a metal coating layer for electromagnetic interference shielding is formed on a semiconductor package itself. However, an external surface of the semiconductor package, on which the metal coating layer is formed, is generally not flat. Moreover, adhesion and reliability become problematic when the metal coating layer is formed.

SUMMARY

An aspect of the present disclosure is to provide a semiconductor package, to which a shielding structure having improved adhesion and reliability is applied, and an electromagnetic interference shielding structure for the semiconductor package.

One proposal of the present disclosure is to introduce an electromagnetic interference shielding structure to an external surface of the semiconductor package. The electromagnetic interference shielding structure is formed by forming a conductive pattern having a plurality of openings on a base layer, forming a first metal layer to cover the conductive pattern layer and the surface of the base layer exposed by the plurality of openings, and forming a second metal layer having a significant thickness using the first metal layer as a seed layer to cover the first metal layer.

According to an aspect of the present disclosure, a semiconductor package includes a connection structure including one or more redistribution layers, a semiconductor chip disposed on the connection structure and electrically connected to the one or more redistribution layers, an encapsulant disposed on the connection structure and covering at least a portion of the semiconductor chip, and a shielding structure covering at least a portion of the encapsulant. The shielding structure includes a conductive pattern layer having a plurality of openings, a first metal layer covering the conductive pattern layer and extending across the plurality of openings, and a second metal layer covering the first metal layer. The second metal layer has a thickness greater than a thickness of the first metal layer.

According to another aspect of the present disclosure, an electromagnetic interference shielding structure includes a conductive pattern layer disposed on a base layer and having a plurality of openings each exposing at least a portion of a surface of the base layer, a first metal layer covering a surface of the conductive pattern layer and the surface of the base layer exposed by the plurality of openings, and a second metal layer covering the first metal layer. The second metal layer has a thickness greater than a thickness of the first metal layer.

According to a further aspect of the present disclosure, a semiconductor package includes a semiconductor chip having opposing first and second surfaces, the first surface having one or more connection pads disposed thereon, an encapsulant covering at least a portion of the second surface of the semiconductor chip, and a shielding structure disposed on the encapsulant and comprising a conductive pattern layer contacting the encapsulant and formed of an adhesive resin having metal nanoparticles dispersed therein.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
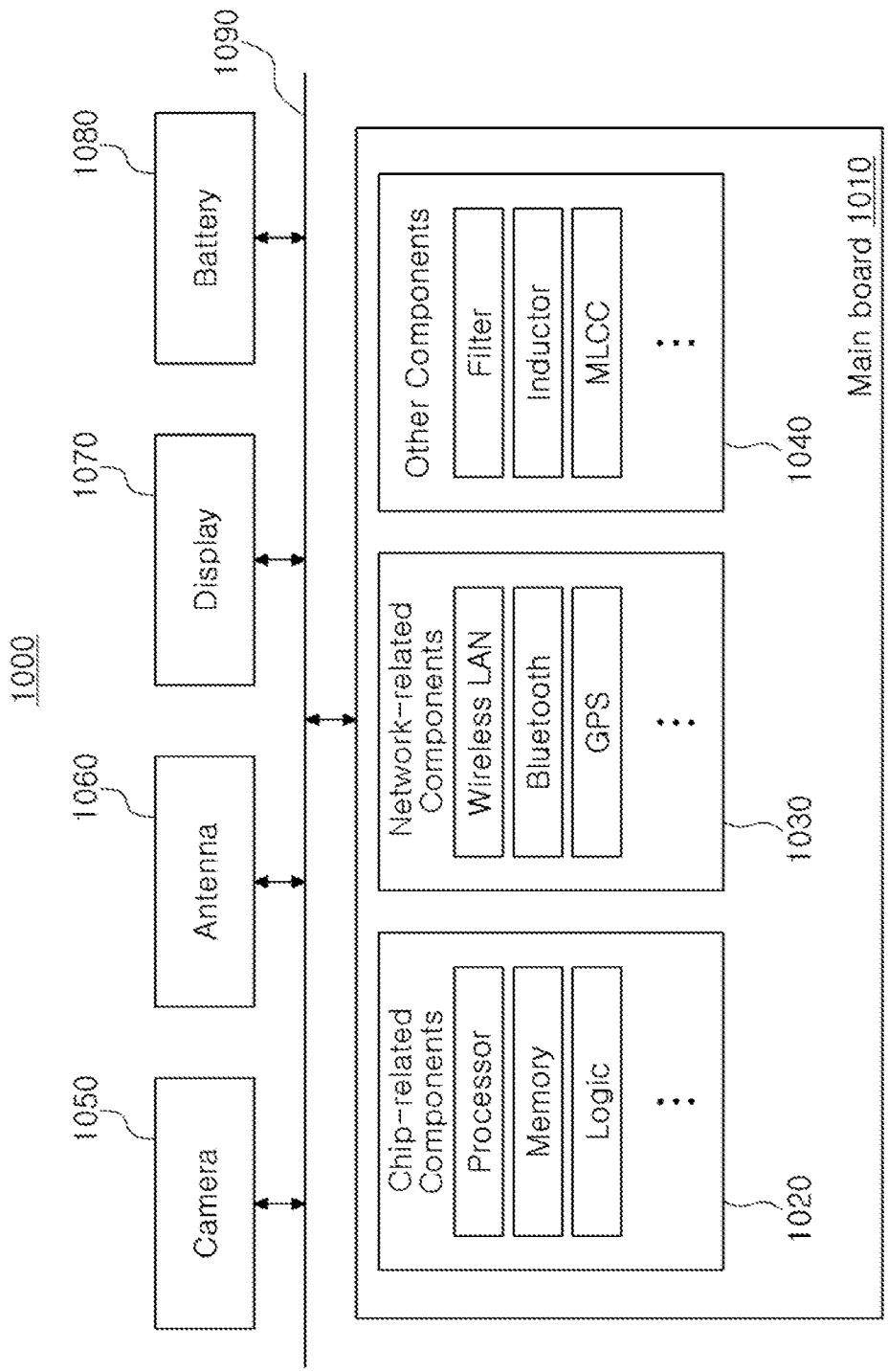
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
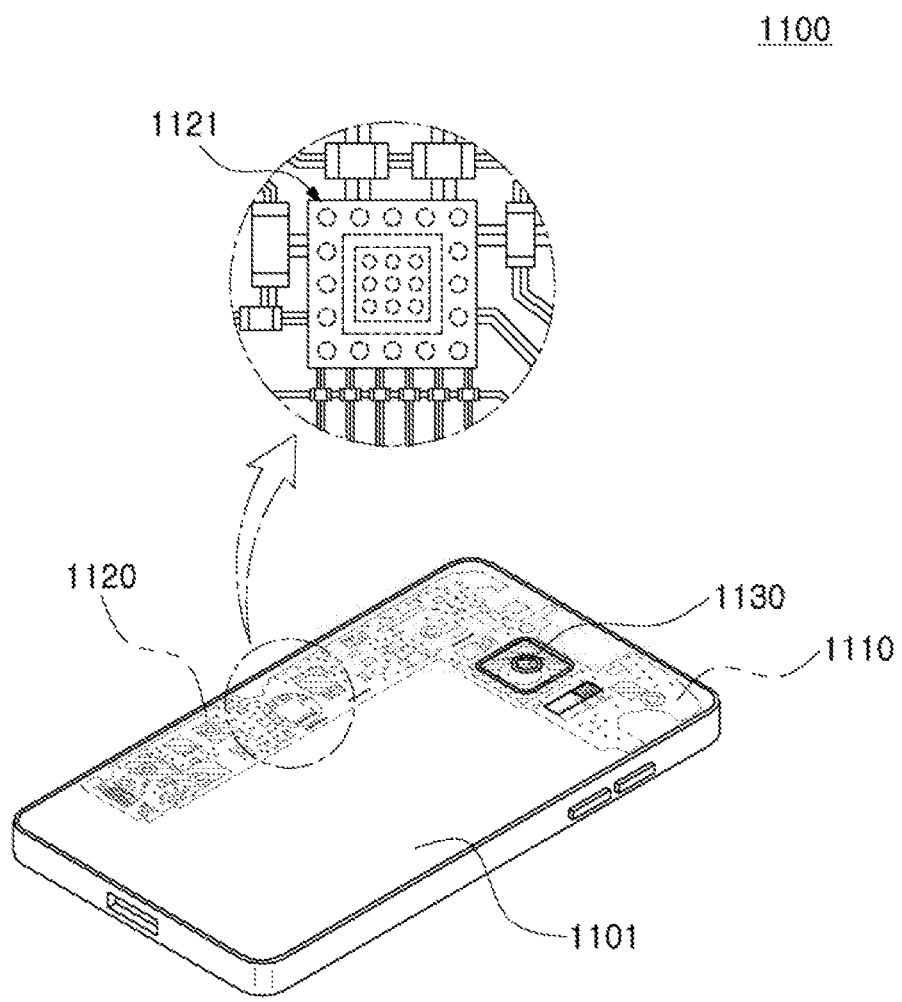
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is provided due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard may therefore be provided.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
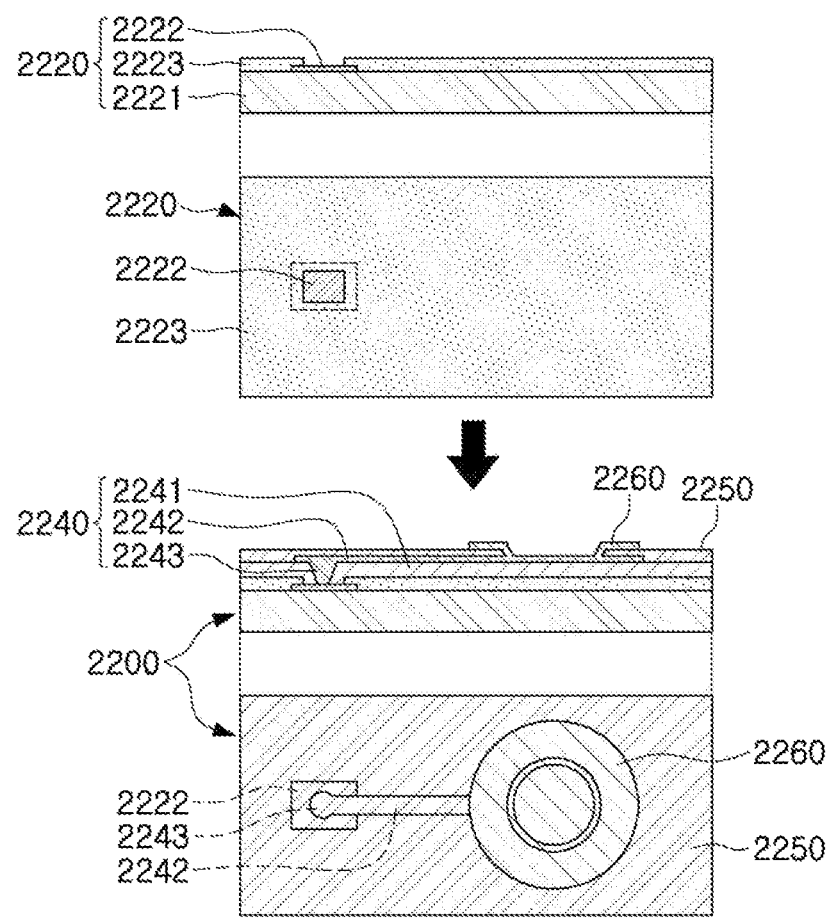
FIGS. 3A and 3B are schematic cross-sectional views illustrating a fan-in semiconductor package before and after being packaged.
Figure 3B:
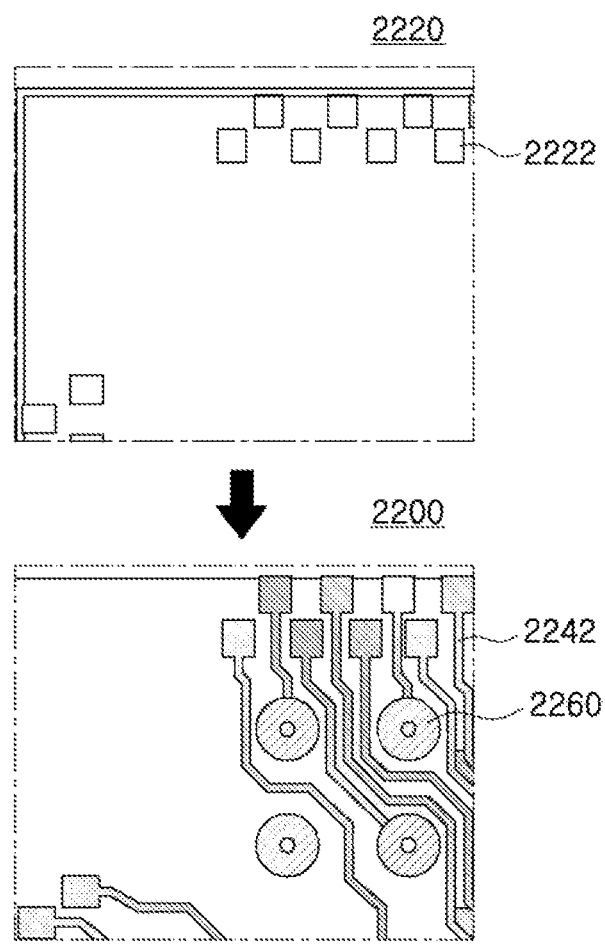

FIGS. 3A and 3B are schematic cross-sectional views illustrating states of a fan-in semiconductor package before and after being packaged.

Figure 4:
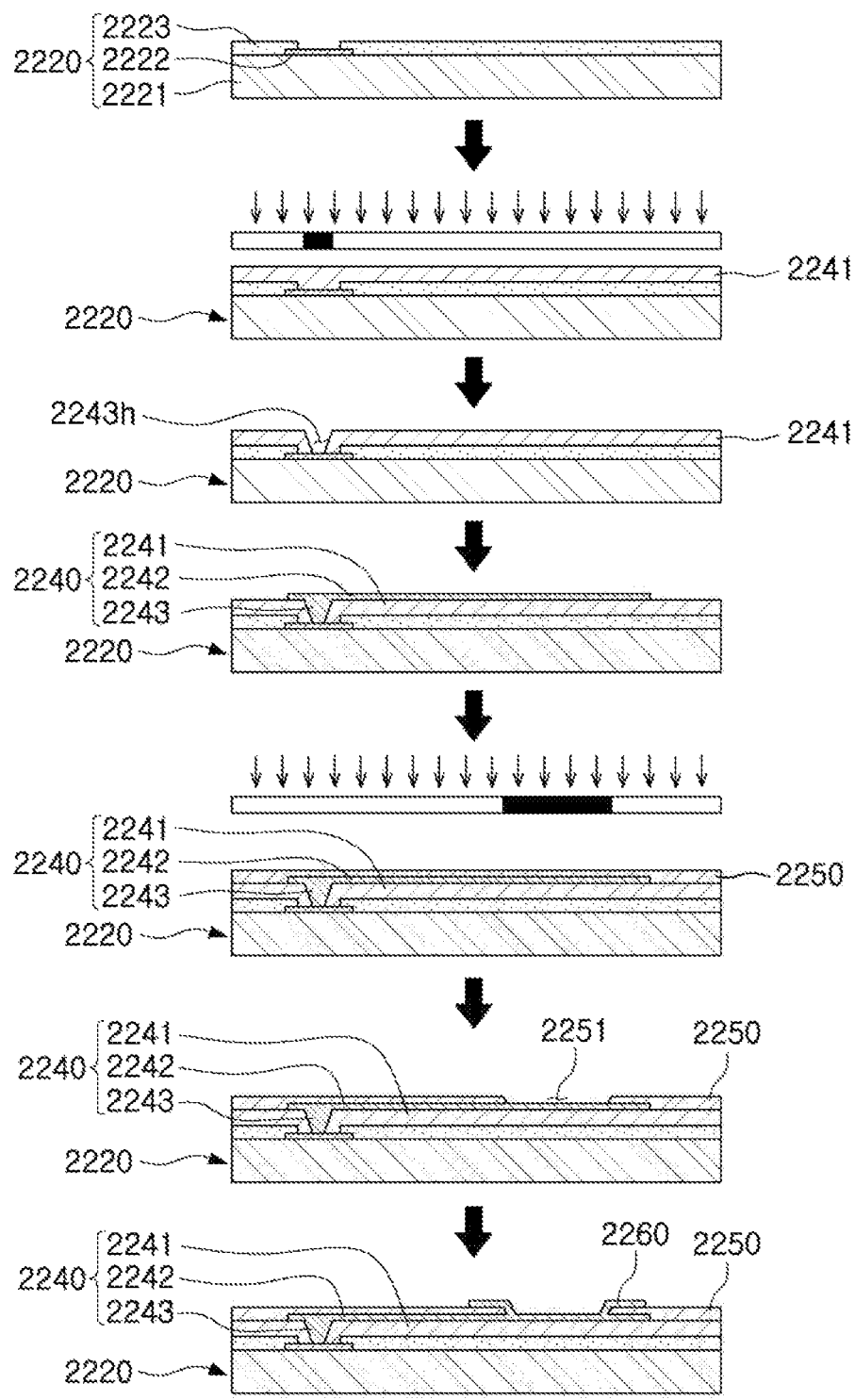
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
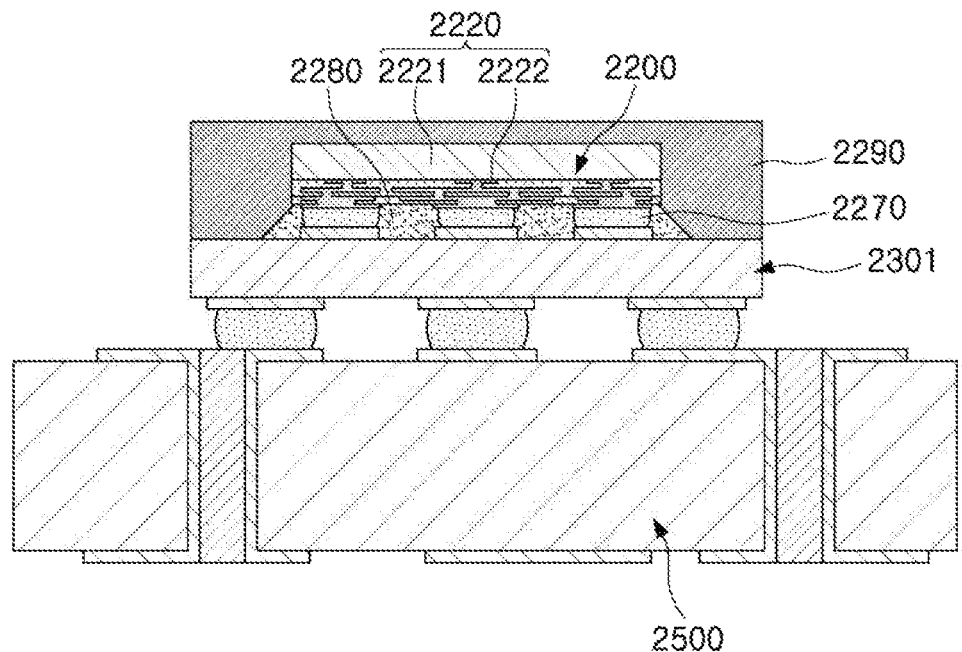
FIG. 5 is a schematic cross-sectional view illustrating a fan-in semiconductor package mounted on a printed circuit board and ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
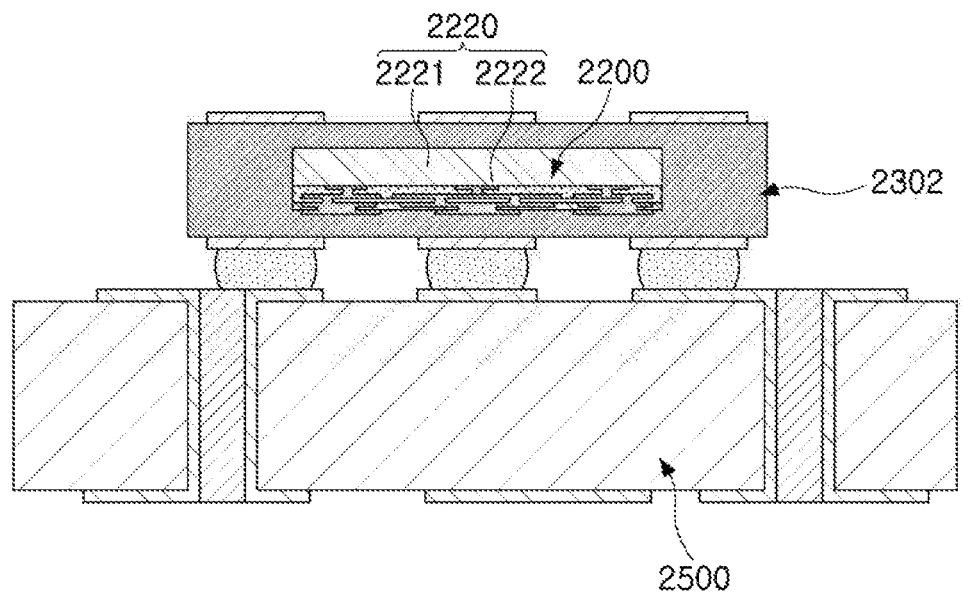
FIG. 6 is a schematic cross-sectional view illustrating a fan-in semiconductor package embedded in a printed circuit board and ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
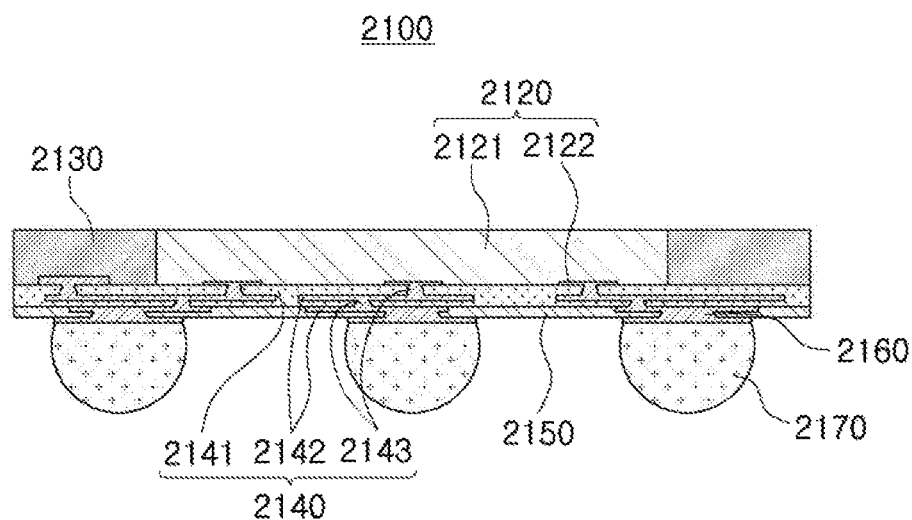
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
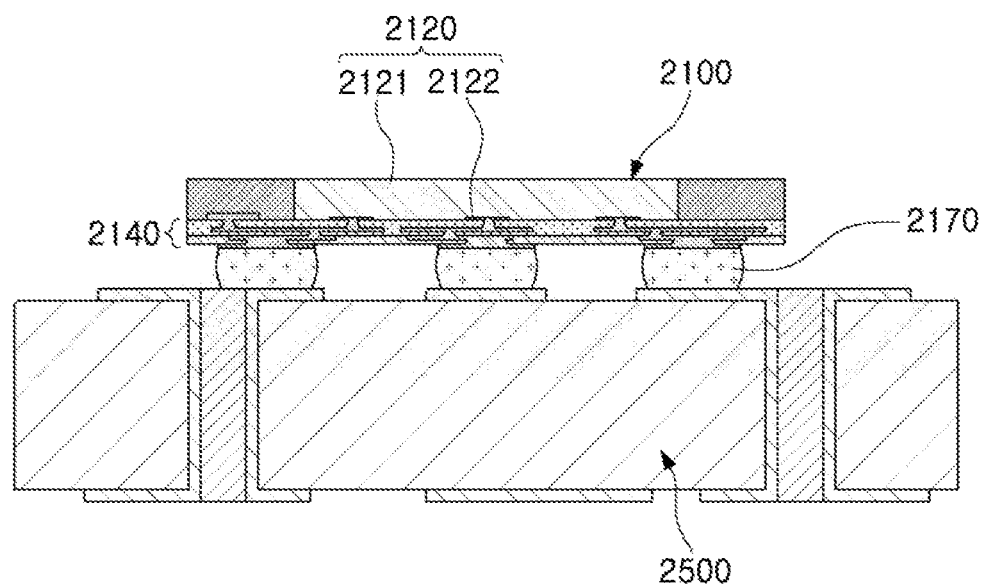
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Hereinafter, a semiconductor package, to which a shielding structure having improved adhesion and reliability is applied, and an electromagnetic interference shielding structure for the semiconductor package will be described with reference to accompanying drawings.

Figure 9:
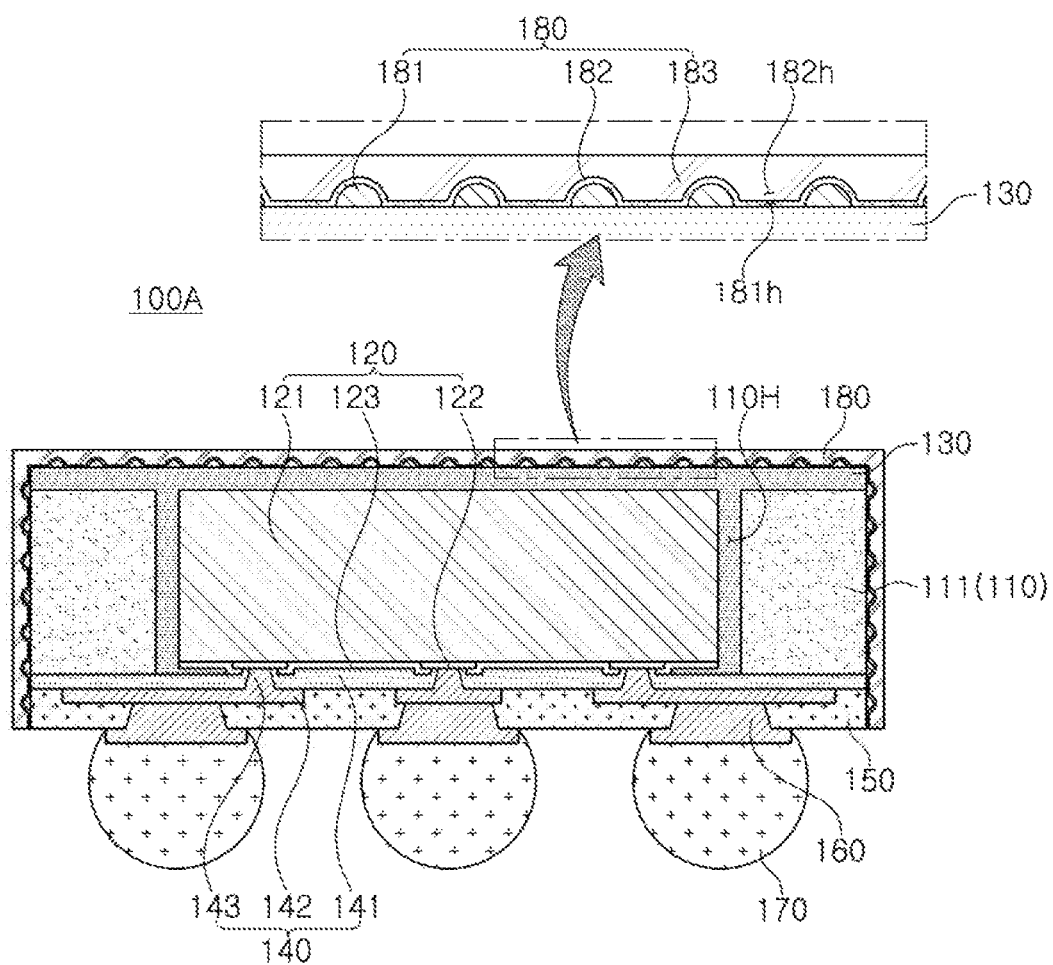
FIG. 9 is a schematic cross-sectional view illustrating an example of a semiconductor package having a shielding structure thereon.

FIG. 9 is a schematic cross-sectional view illustrating an example of a semiconductor package.

Referring to FIG. 9, a fan-out semiconductor package according to an example includes a frame 110 having a through-hole 110H, a semiconductor chip 120, disposed in the through-hole 110H, having an active surface on which a connection pad 122 is disposed and an inactive surface disposed to oppose the active surface, an encapsulant 130 covering at least a portion of each of the frame 110 and the inactive surface of the semiconductor chip 120 and filling at least a portion of the through-hole 110H, at least one connection structure 140, disposed on the frame 110 and the active surface of the semiconductor chip 120, having at least one redistribution layer 142 electrically connected to the connection pad 122, a passivation layer 150 disposed on the connection structure 140, a plurality of underbump metal portions 160 respectively connected to a plurality of openings of the passivation layer 150, and a shielding structure 180 covering a top surface of the encapsulant 130 and extending to cover a side surface of the encapsulant 130, a side surface of the frame 110, and a side surface of the connection structure 140.

The shielding structure 180 includes a conductive pattern layer 181 having a plurality of openings 181h, a first metal layer 182 covering the conductive pattern layer 181 and blocking or extending integrally across the plurality of openings 181h, and a second metal layer 183 covering the first metal layer 182. The first metal layer 182 may be formed to have a small thickness by electroless plating such as sputtering to block all of the plurality of openings 181h, and the second metal layer 183 may be formed to have a great thickness by electrolytic plating to have an improved electromagnetic interference shielding effect. Accordingly, the second metal layer 183 may have a thickness greater than a thickness of the first metal layer 182.

According to a shielding technique employed in recent years, a metal coating layer for electromagnetic interference shielding is formed on a semiconductor package itself. However, an external surface of the semiconductor package, on which the metal coating layer is formed, is generally not flat. Moreover, adhesion and reliability become problematic when the metal coating layer is formed. For example, after a plurality of semiconductor packages are simultaneously formed at a wafer or panel level, they are singulated by dicing. After the dicing, a molding material or a panel material may be disposed in a region, from which an inorganic filler is removed, or an external surface to which a glass fiber is exposed. Accordingly, when a metal coating layer is formed there, adhesion between the molding material and the metal coating layer may be reduced to cause lifting. In addition, since surface unevenness results from the exposure of the glass fiber to the panel material and outflow of the inorganic filler, there may be a region in which formation of the metal coating layer using metal sputtering and plating is not appropriately performed. For example, a coverage issue may occur.

Meanwhile, in the package 100A according to an example embodiment, the conductive pattern layer 181, having a plurality of openings 181h, is formed on the external surface of the package 100A. In this case, since the conductive pattern layer 181 may have a conductive mesh structure in which metal nanoparticles are dispersed in an adhesive resin, the package 100A may have improved adhesion and reliability even when the external surface of the package 100A is uneven. Next, the first metal layer 182 is formed by metal sputtering or the like. The first metal layer 182 covers the conductor pattern layer 181, and may be formed to have a small thickness to block the plurality of openings 181h. Since the first metal layer 182 is formed in the case in which the conductive pattern layer 181 was already formed, the first metal layer 182 may also have improved adhesion and reliability although the external surface of the package 100A is uneven, as set forth above. Next, the second metal layer 183 is formed using the first metal layer 182 as a seed layer by electrolytic plating or the like. The second metal layer 183 covers the first metal layer 182. The second metal layer 183 may be disposed on the first metal layer 182, and may also have improved adhesion and reliability. The second metal layer 183 may have a significant thickness, and may have an improved electromagnetic interference shielding effect and may also have a heat dissipation effect.

The package 100A according to an example has an external surface as a base layer on which an electromagnetic interference shielding structure is disposed. The electromagnetic interference shielding structure includes the conductive pattern layer 181 having a plurality of openings 181h, each exposing at least a portion of a surface of the base layer, the first metal layer 182 covering the surface of the base layer exposed by the plurality of openings 181h, and the second metal layer 183 covering the first metal layer 182 and having a thickness greater than a thickness of the first metal layer 182. The package 100A, including the electromagnetic interference shielding structure, may have adhesion and reliability and effectively shield electromagnetic interference and, furthermore, may have a heat dissipation effect.

Hereinafter, the components included in the package 100A according to an example embodiment will be described in further detail.

The frame 110 may further improve rigidity of the package 100A depending on certain materials and may serve to secure thickness uniformity and the like of the encapsulant 130. The frame 110 has a through-hole 110H. In the through-hole 110H, the semiconductor chip 120 is disposed to be spaced apart from the frame 110 by a predetermined distance. Side surfaces of the semiconductor chip 120 may be surrounded by the frame 110. However, such a form is only an example and may be variously modified to have other forms, and the frame 110 may perform another function depending on such a form. As appropriate, the frame 110 may be omitted.

The frame 110 includes an insulating layer 111. An insulating material may be used as a material of the insulating layer 111. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. When a high-rigidity material such as prepreg including a glass fiber or the like is used, the frame 110 may be used as a support member for controlling warpage of the package 100A or a core member. The through-hole 110H may extend through the insulating layer 111.

The semiconductor chip 120 may be an integrated circuit (IC) providing several hundred to several million or more elements integrated in a single chip. The semiconductor chip 120 may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the semiconductor chip 120 is not limited thereto, and may be a logic chip such as an analog-to-digital converter, an application-specific integrated circuit (ASIC), or a memory chip such as a volatile memory (for example, a DRAM), a nonvolatile memory (for example, a ROM), a flash memory, or the like. In addition, two or more of the abovementioned elements may be combined with each other and be disposed in the through-hole 110H of the package 100A.

The semiconductor chip 120 may be an IC formed based on an active wafer. In this case, a base material of a body 121 may be silicon (Si), germanium (Ge), gallium arsenide (GaAs), or the like. Various circuits may be formed on the body 121. The connection pad(s) 122 may electrically connect the semiconductor chip 120 to other components. A material of the connection pad(s) 122 may be a metal such as aluminum (Al), but is not limited thereto. A passivation layer 123 may be disposed on the body 121 to expose the connection pad(s) 122, and may be an oxide layer, a nitride layer, or the like. Alternatively, the passivation layer 123 may be a double layer of an oxide layer and a nitride layer. A bottom surface of the connection pad 122 may have a step with respect to (or be spaced apart from) a bottom surface of the encapsulant 130 through the passivation layer 123, and the encapsulant 130 may thereby be prevented from bleeding into the bottom surface of the connection pad 122 to some extent. An insulating layer, not illustrated, and the like, may be further disposed in other appropriate positions. The semiconductor chip 120 may be a bare die. A redistribution layer, not illustrated, may be further disposed on the active surface of the semiconductor chip 120, and bumps, not illustrated, or the like, may be connected to the connection pad 122.

The encapsulant 130 may protect the frame 110 and the semiconductor chip 120. An encapsulation form is not limited as long as the encapsulant 130 covers at least a portion of the frame 110 and at least a portion of the semiconductor chip 120. For example, the encapsulant 130 may cover at least a portion of each of the frame 110 and the inactive surface of the semiconductor chip 120, and may fill at least a portion of the through-hole 100H. The encapsulant 130 may fill the through-hole 100H to serve as an adhesive depending on certain materials and to reduce buckling.

A material of the encapsulant 130 is not limited. For example, an insulating material may be used as a material of the encapsulant 130. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, for example, prepreg, Ajinomoto Build-up Film (ABF), FR-4, Bismaleimide Triazine (BT), or the like. As appropriate, a photoimageable dielectric material such as a photoimageable encapsulant (PIE) may be used as a material of the encapsulant 230.

The connection structure 140 may redistribute the connection pad(s) 122 of the semiconductor chip 120. Several tens to several hundreds of connection pads 122, having various functions, may be redistributed through the connection structure 140 and may be physically and/or electrically connected through the electrical connection metal 170 depending on the functions thereof. The connection structure 140 includes an insulating layer 141 disposed on the active surface of the semiconductor chip 120, one or more redistribution layer(s) 142 disposed on the insulating layer 141, and one or more connection via(s) 143 penetrating through the insulating layer 141 and electrically connecting the connection pad 122 of the semiconductor chip 120 to the redistribution layer 142. The insulating layer 141, the redistribution layer 142, and the connection vias 143 of the connection structure 140 may include a larger number of layers and/or vias than those illustrated in the drawings.

A material of the insulating layers 141 may be an insulating material. In this case, a photoimageable dielectric (PID) material such as a PID resin may also be used as the insulating material in addition to the above-described insulating materials. For example, the insulating layers 141 may be a photosensitive insulating layer. When the insulating layer 141 has photosensitive properties, a fine pitch of the connection via 143 may be achieved more easily. The insulating layer 141 may be a photosensitive insulating layer including an insulating resin and an inorganic filler. When the insulating layer 141 includes multiple layers, materials of the multiple layers may be identical to each other or, as appropriate, may be different from each other. When the insulating layer 141 includes multiple layers, the multiple layers are integrated with each other, such that boundaries therebetween may not be readily apparent.

The redistribution layer(s) 142 may redistribute the connection pad(s) 122 of the semiconductor chip 120 to electrically connect the redistributed connection pad(s) 122 to the electrical connection metal 170. A material of the redistribution layer 142 may also be a metal such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 142 may include a ground (GND) pattern, a power (PWR) pattern, a signal (S) pattern, and the like. The ground (GND) pattern and the power (PWR) pattern may be identical to each other. The redistribution layer 142 may include various types of via pad(s), electrical connection metal pad(s), or the like. The redistribution layer 142 may also be formed by a plating process and may include a seed layer and a plating layer.

The connection via(s) 143 may electrically connect the redistribution layer(s) 142, the connection pad(s) 122, and the like, disposed on different layers. As a result, an electrical path is formed in the package 100A. A material of the connection via(s) 143 may also be a metal such as copper (Cu), aluminum (Al), silver (Ag), tin (Sn), gold (Au), nickel (Ni), lead (Pb), titanium (Ti), or alloys thereof. The connection via(s) 143 may include a via for signal, a via for power, a via for ground, or the like, and the via for power and the via for ground may be identical to each other. The connection via 143 may be a filled-type via filled with a metal, or a conformal-type via formed along a wall surface of a via hole. Moreover, the connection via 143 may have a tapered cross-sectional shape. The connection via 143 may also be formed by a plating process, and may include a seed layer and a plating layer.

The passivation layer 150 may be additionally configured to protect the connection structure 140 from external physical and chemical damage and the like. The passivation layer 150 may have an opening exposing at least a portion of the redistribution layer 142. Several tens to several tens of thousands of openings may be formed in the passivation layer 150. A material of the passivation layer 150 is not limited. For example, the material of the passivation layer 150 may be an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, the material of the passivation layer 150 may be a solder resist.

The underbump metal 160 may be additionally configured to improve connection reliability of the electrical connection metal 170 and to improve board level reliability of the package 100A. The underbump metal 160 is connected to the redistribution layer 142 exposed through the opening of the passivation layer 150. The underbump metal 160 may be formed in the openings of the passivation layer 150 by a known metallization method using a known conductive material such as a metal, but is not limited thereto.

The connection terminals 170 may also be additionally configured to physically and/or electrically connect the semiconductor package 100A to an external component. For example, the semiconductor package 100A may be mounted on a mainboard of an electronic device through the connection terminals 170. Each of the connection terminals 170 may be formed of a low melting-point metal, for example, tin (Sn) or a Sn-containing ally. More specifically, each of the connection terminals 170 may be formed of a solder or the like, but a material of the connection terminals 170 is not limited thereto.

Each of the connection terminals 170 may be a land, a ball, a pin, or the like. The connection terminals 170 may be formed as a multilayer structure or a single-layer structure. When the connection terminals 170 are formed as a multilayer structure, the connection terminals 170 may include a copper (Cu) pillar and a solder. When the connection terminals 170 are formed as a single-layer structure, the connection terminals 170 may include a tin-silver solder or copper (Cu). However, these are merely examples, and a structure and a material of the electrical connection metal 170 are not limited thereto. The number, interval, dispositional form, and the like, of the electrical connection metal 170 are not limited, but may be sufficiently modified depending on design. For example, several tens to several tens of thousands of electrical connection metals 170 may be provided according to the number of connection pads 122. The number of electrical connection metals 170 may be greater than or smaller than several tens to several tens of thousands.

At least one of the electrical connection metals 170 may be disposed in a fan-out region. The term "fan-out region" refers to a region except for (or outside of) a region in which the semiconductor chip 120 is disposed (e.g., outside of a region of overlap with the semiconductor chip 120 along a stacking direction of the semiconductor chip 120 on the connection structure 140). The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

The shielding structure 180 may implement electromagnetic interference shielding of the semiconductor package 100A and may improve a heat dissipation effect. The shielding structure 180 may cover a top surface of the encapsulant 130 and extend to cover a side surface of the encapsulant 130, a side surface of the frame 110, and a side surface of the connection structure 140. The shielding structure 180 includes a conductive pattern layer 181 having a plurality of openings 181h, a first metal layer 182 covering the conductive pattern layer 181 and blocking the plurality of openings 181h, and a second metal layer 183 covering the first metal layer 182. Accordingly, the package 100A may have improved adhesion between the shielding structure 180 and the top surface and the side surface of the encapsulant 130, serving as abase layer, the side surface of the frame 110, and the side surface of the connection structure 140, and improved reliability such as full area coverage.

The conductive pattern layer 181 may be formed by a self-aligning manner using a metal nanoparticle coating solution, such as a silver nanoparticle coating solution, which may have a plurality of openings 181h. The metal nanoparticle coating solution may include metal nanoparticles and an adhesive resin. The metal nanoparticles may be metal nanoparticles of silver, a silver-copper alloy, a silver-palladium alloy, or other silver alloy, but is not limited thereto and metal nanoparticles of other metals may be used. The adhesive resin may be a known insulating resin such as an acrylic resin or an epoxy resin, in detail, an insulating resin including an acrylic monomer, but is not limited thereto. The metal nanoparticle coating solution may contain another additive such as a surfactant and a solvent in addition to the metal nanoparticles and the binder resin. The coating may be performed using a coating method selected from spray coating, spin coating, slit coating, or any other appropriate coating method.

As described above, the metal nanoparticle coating solution may be used to rapidly and easily form the conductive pattern layer 181 having a conductive mesh structure. In detail, a coating process may be performed to the conductor pattern layer 181 having a large-area conductive mesh structure. Moreover, since low-viscosity spray coating may be performed, the conductive pattern layer 181 may be easily formed even when the base layer is an inclined surface or a side surface, similarly to the side surface of the encapsulant 130, the side surface of the frame 110, and the side surface of the connection structure 140.

The first metal layer 182 is formed to have a small thickness along a surface of the conductive pattern layer 181 and a surface of the base layer exposed by the plurality of openings 181h, and thus, may serve as a seed layer. The first metal layer 182 may be formed by electroless plating, in detail, metal sputtering. Since the first metal layer 182 may be formed to have a small thickness, the first metal layer 182 may easily block the plurality of openings 181h without voids. The first metal layer 182 may include a metal such as at least one of copper (Cu), aluminum (Al), silver (Ag), tin (Sn), gold (Au), nickel (Ni), lead (Pb), titanium (Ti), or alloys thereof. For example, the first metal layer 182 may be a titanium (Ti) layer or a double layer of titanium (Ti)/copper (Cu), but is not limited thereto. Since the first metal layer 182 may be formed to have a small thickness by metal sputtering or the like along the surface of the conductive pattern layer 181 and the surface of the base layer exposed by the plurality of openings 181h, the first metal layer 182 may have a concave portion 182h disposed in each of the openings 181h.

The second metal layer 183 is formed on the first metal layer to have a significant thickness to cover the first metal layer 182 using the first metal layer 182 as a seed layer. Thus, the second metal layer performs not only an electromagnetic interference shielding function but also a heat dissipation function. The second metal layer 183 may be formed by electrolytic plating and may be formed of copper (Cu), aluminum (Al), silver (Ag), tin (Sn), gold (Au), nickel (Ni), Titanium (Ti), or alloys thereof. For example, the second metal layer 183 may be a copper (Cu) electrolytic plating layer, but is not limited thereto. The second metal layer 183 may fill each concave portion 182h of the first metal layer 182.

Depending on the thickness of the second metal layer 183, the second metal layer 183 may also have a concave portion on its outer surface in a region corresponding to the concave portion 182h of the first metal layer 182. In this case, the concave portion of the second metal layer 183 may have a depth smaller than a depth of the concave portion 182h of the first metal layer 182. In other embodiments, however, the second metal layer 183 may have a substantially planar outer surface.

Although not illustrated in the drawing, a metal thin film may be formed on a wall surface of the through-hole 110H to achieve heat dissipation and electromagnetic interference shielding. As appropriate, a plurality of semiconductor chips 120, performing the same function or different functions, may be disposed in the through-hole 110H, and/or multiple through-holes 110H may be provided each with one or more semiconductor chips 120 disposed therein. As appropriate, an additional passive component such as an inductor or a capacitor may be disposed in the through-hole 110H. As appropriate, a surface-mount (SMT) component, including a passive component such as an inductor, capacitor, and the like, may be disposed on a surface of the passivation layer 150.

Figure 10A:
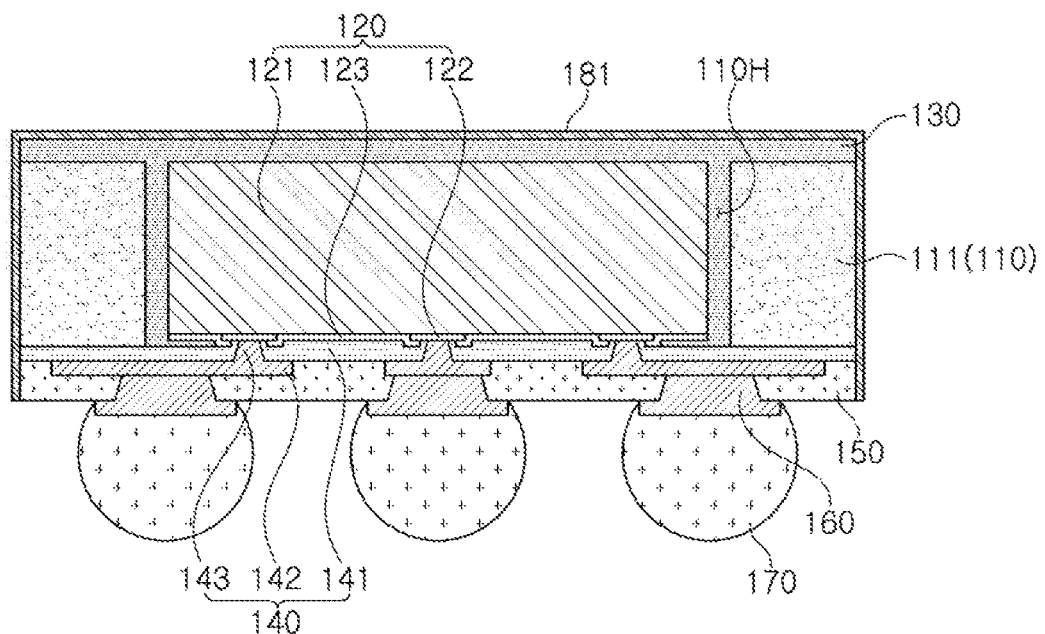
FIG. 10A is a schematic cross-sectional view illustrating a conductive pattern layer formed on an external surface of a semiconductor package.
Figure 10B:
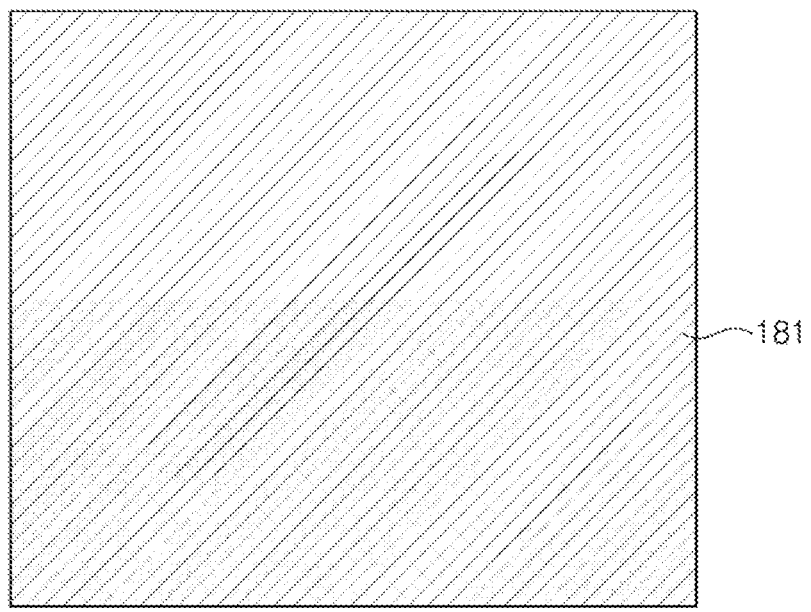
FIG. 10B is a schematic plan view of the conductive pattern layer in FIG. 10A viewed from above.

FIG. 10A is a schematic cross-sectional view illustrating that a conductive pattern layer is formed on an external surface of a semiconductor package, and FIG. 10B is a schematic plan view of the conductive pattern layer in FIG. 10A when viewed from above.

Referring to FIGS. 10A and 10B, the above-mentioned metal nanoparticle coating solution is coated on a top surface and a side surface of an encapsulant 130, provided as a base layer, a side surface of a frame 110, and a side surface of a connection structure 140 by spray coating, or the like, to forma coating layer, in detail, a conductive pattern layer 181.

Figure 11A:
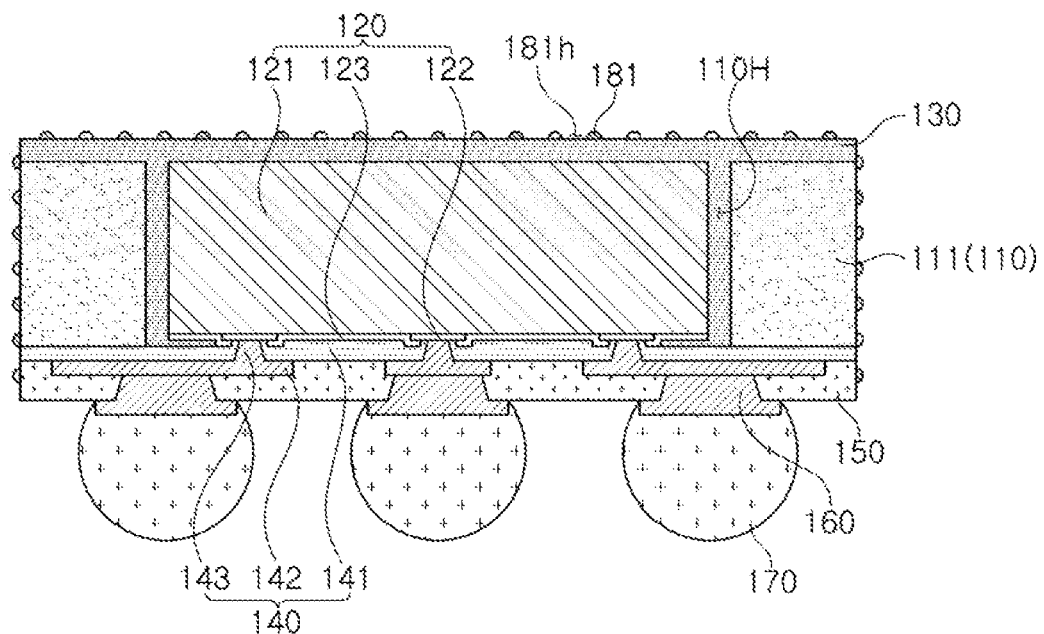
FIG. 11A is a schematic cross-sectional view illustrating a plurality of openings formed in a conductive pattern layer disposed on an external surface of a semiconductor package.
Figure 11B:
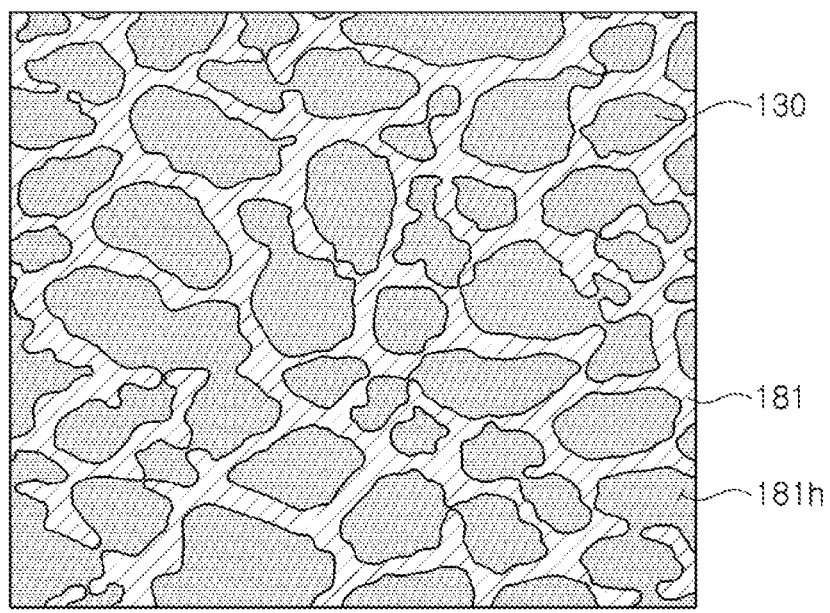
FIG. 11B is a schematic plan view of the conductive pattern layer in FIG. 11A viewed from above.

FIG. 11A is a schematic cross-sectional view illustrating a plurality of openings are formed in a conductive pattern layer disposed on an external surface of a semiconductor package, and FIG. 11B is a schematic plan view of the conductive pattern layer in FIG. 11A when viewed from above.

Referring to FIGS. 11A and 11B, a plurality of openings 181h are formed in the conductive pattern layer 181 using a self-aligning manner to respectively expose a surface of a base layer (e.g., a base layer of the top surface of the encapsulant 130, the side surface of the encapsulant 130, the side surface of the frame 110, and/or the side surface of the connection structure 140). In detail, a conductive pattern layer 181 having a conductive mesh structure is implemented.

Figure 12A:
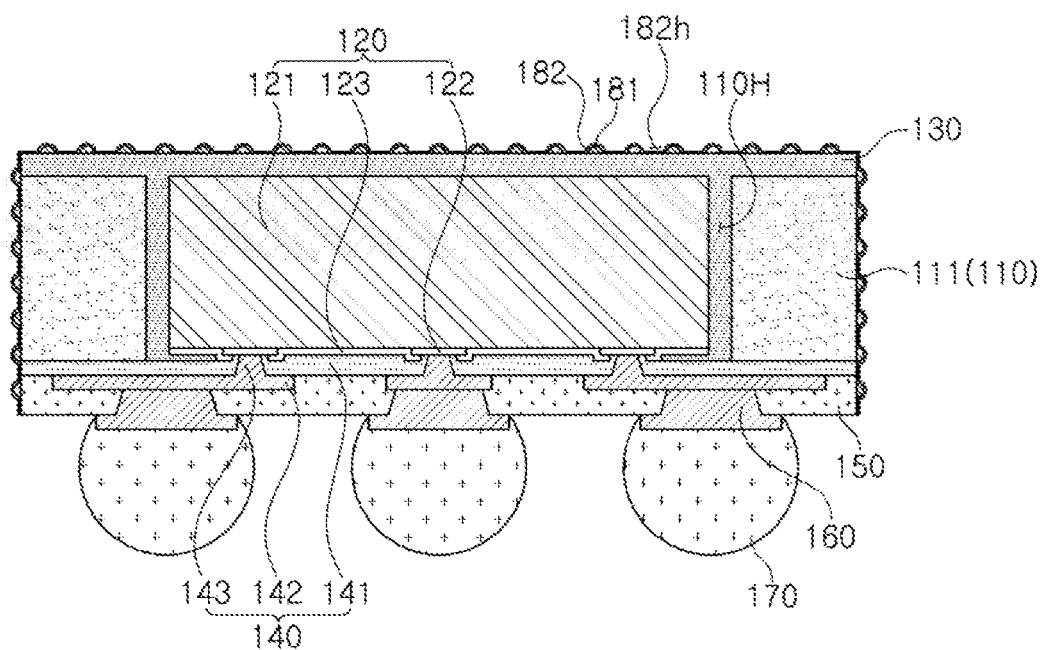
FIG. 12A is a schematic cross-sectional view illustrating a first metal layer further disposed on an external surface of a semiconductor package.
Figure 12B:
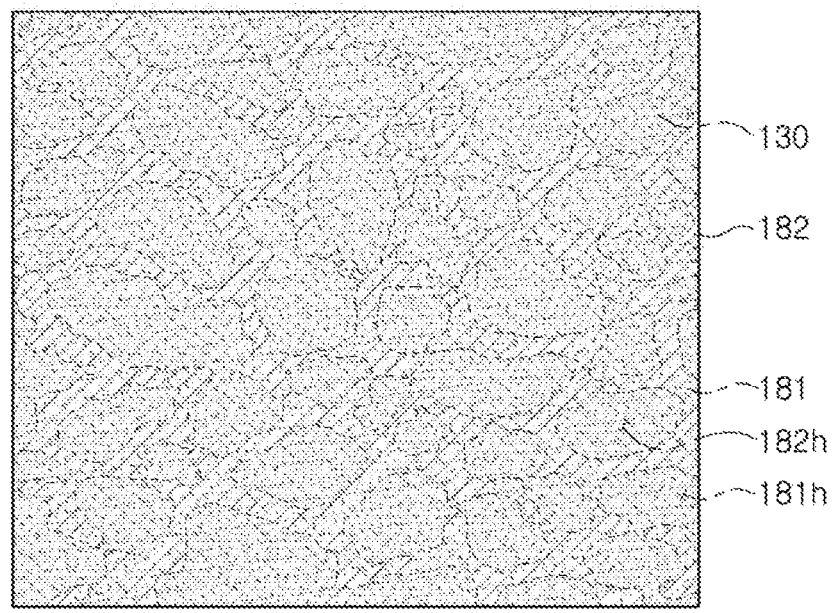
FIG. 12B is a schematic plan view of the first metal layer in FIG. 12A viewed from above.

FIG. 12A is a schematic cross-sectional view illustrating that a first metal layer is further disposed on an external surface of a semiconductor package, and FIG. 12B is a schematic plan view of the first metal layer in FIG. 12A when viewed from above (and in which the first metal layer is shown as being semi-transparent for illustrative purposes).

Referring to FIGS. 12A and 12B, a first metal layer 182 is formed by electroless plating, for example, metal sputtering, or the like, to cover a surface of the conductive pattern layer 181 and a surface of the base layer exposed by the plurality of openings 181h. The first metal layer 182 is formed to have a relatively small thickness and to block all the plurality of openings 181h of the conductive pattern layer 181. As a result, the first metal 182 has a concave portion 182h in each of the openings 181h.

Figure 13A:
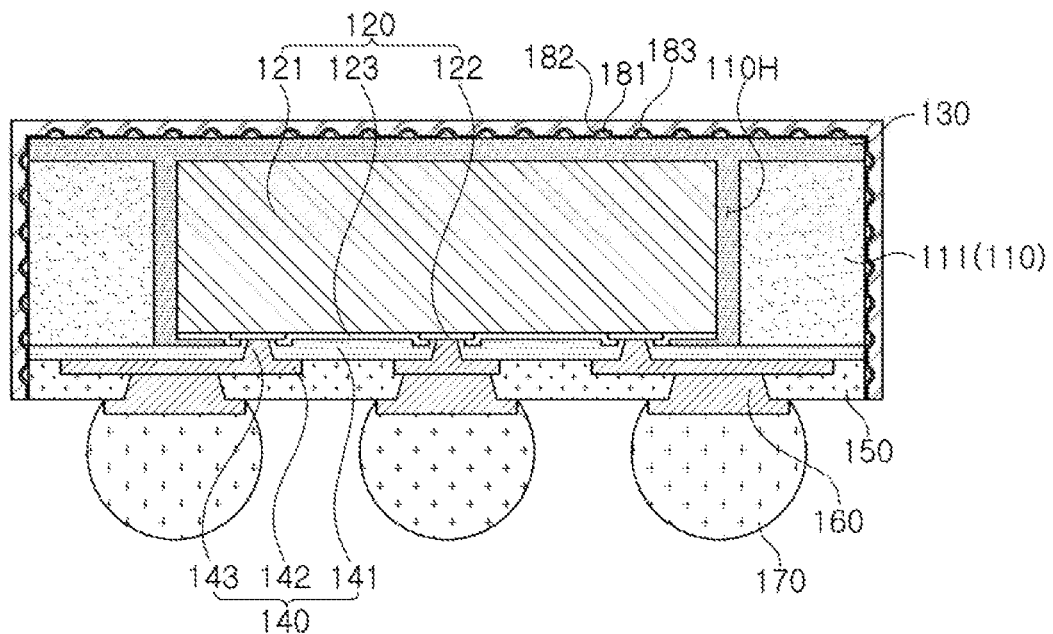
FIG. 13A is a schematic cross-sectional view illustrating a second metal layer further disposed on an external surface of a semiconductor package.
Figure 13B:
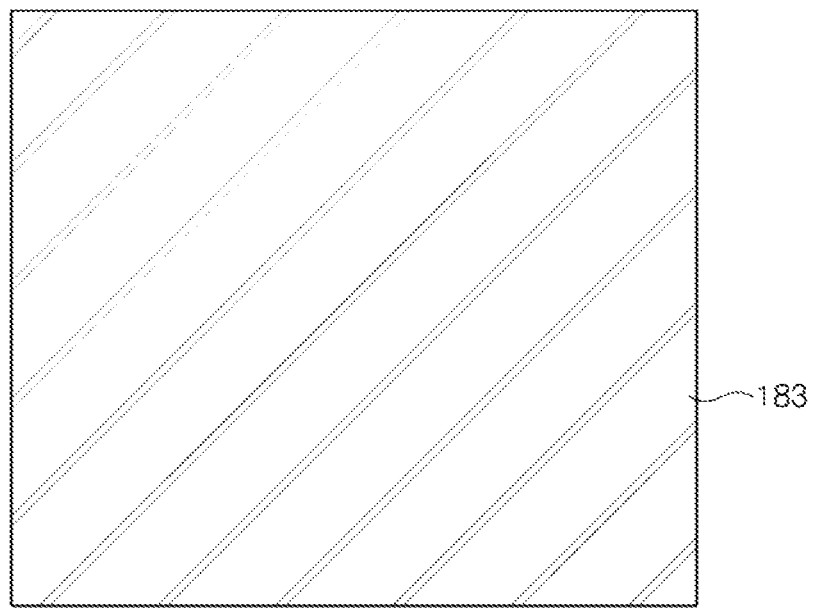
FIG. 13B is a schematic plan view of the second metal layer in FIG. 13A viewed from above.

FIG. 13A is a schematic cross-sectional view illustrating that a second metal layer is further disposed on an external surface of a semiconductor package, and FIG. 13B is a schematic plan view of the second metal layer in FIG. 13A when viewed from above.

Referring to FIGS. 13A and 13B, a second metal layer 183 is formed by electrolytic plating, or the like, using the first metal layer 182 as a seed layer to cover the first metal layer 182. The second metal layer 183 is formed to have a relatively great thickness, and fills each concave portion 182h of the first metal layer 182. As a result, a metal shielding layer is formed on an entire surface of the base layer.

Figure 14:
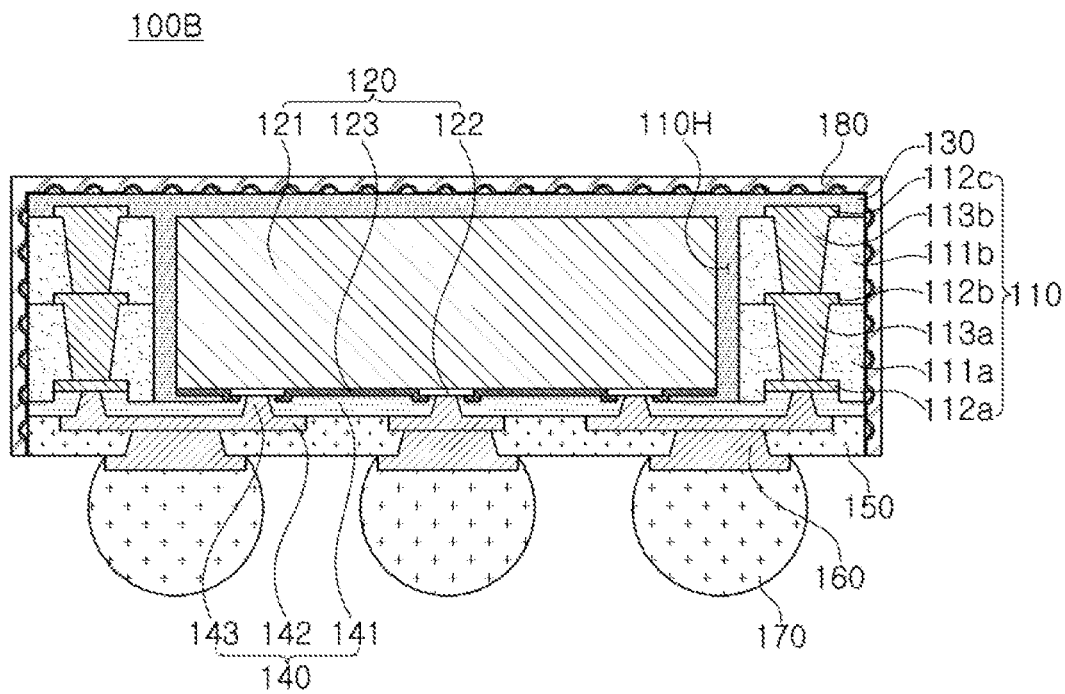
FIG. 14 is a schematic cross-sectional view illustrating another example of a semiconductor package.

FIG. 14 is a schematic cross-sectional view illustrating an example of a semiconductor package according to another example.

Referring to FIG. 14, a semiconductor package 100B according to another example includes a frame 110 in contact with a connection structure 140, the frame 110 including a first insulating layer 111a, a first wiring layer 112a embedded in the first insulating layer 111a while being in contact with the connection structure 140, a second wiring layer 112b disposed on a side of the first insulating layer 111a opposing a side in which the first wiring layer 112a is embedded, a second insulating layer disposed on the first insulating layer 111a to cover the second wiring layer 112b, and a third wiring layer 112c disposed on the second insulating layer 111b. The first to third wiring layers 112a, 112b, and 112c are electrically connected to a connection pad 122. The first wiring layers 112a and the second and third wiring layers 112b and 112c are electrically connected to each other through first and second wiring vias 113a and 113b penetrating through the first and second insulating layers 111a and 111b, respectively. Since the frame 110 includes a great number of wiring layers 112a, 112b, and 112c, the connection structure 140 may be simplified. As a result, a decrease in yield, occurring during formation of the connection structure 140, may be prevented.

A material of the insulating layers 111a and 111b is not limited. For example, an insulating material may be used as a material of the insulating layers 111a and 111b. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. As appropriate, PID may be used as the insulating material.

The wiring layers 112a, 112b, and 112c may redistribute the connection pad(s) 122 of the semiconductor chip 120. A material of the wiring layers 112a, 112b, and 112c may also be a metal such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on a design of a corresponding layer. For example, the wiring layers 112a, 112b, and 112c may include a ground (GND) pattern, a power (PWR) pattern, a signal (S) pattern, and the like. The ground (GND) pattern and the power (PWR) pattern may be identical to each other. The redistribution layer 142 may include various types of via pad, electrical connection metal pad, or the like. The wiring layers 112a, 112b, and 112c may also be formed by a plating process and may include a seed layer and a plating layer.

When the first wiring layer 112a is embedded in the first insulating layer 111a, a step, caused by the thickness of the first wiring layer 112a, may be significantly reduced to maintain an insulation distance constant. For example, a difference between a distance from the redistribution layer 142 to a bottom surface of the first insulating layer 111a and a distance from the redistribution layer 142 to the connection pad of the semiconductor chip 120 may be smaller than a thickness of the first wiring layer 112a. Thus, a high-density wiring design of the connection structure 140 may be readily performed. The first wiring layer 112a may be recessed into the insulating layer 111. In this case, a bottom surface of the first insulating layer 111a and a bottom surface of the first wiring layer 112a may have a step. Accordingly, bleeding of a material of the encapsulant 130 may be suppressed to prevent the first wiring layer 112a from being contaminated by the material of the encapsulant 130. The second wiring layer 112b may be disposed between an active surface and an inactive surface of the semiconductor chip 120. The frame 110 may be formed to have a thickness corresponding to a thickness of the semiconductor chip 120. Accordingly, the second wiring layer 112b, formed inside the frame 110, may be disposed at a level between the active surface and the inactive surface of the semiconductor chip 120 in a thickness direction of the semiconductor chip 120. Each of the wiring layers 112a, 112b, and 112c may have a thickness greater than a thickness of the redistribution layer 142. This is because the wiring layers 112a, 112b and 112c may be formed to have a larger scale depending on the thickness of the frame 110, while the redistribution layer 142 may be finely designed and thinned.

The wiring vias 113a and 113b electrically connect the wiring layers 112a, 112b, and 112c, disposed on different layers, to form an electrical path in the frame 110. The above-mentioned metal may also be used as a material forming the wiring vias 113a and 113b. Each of the wiring vias 113a and 113b may include a via for signals, a via for power, a via for a ground, or the like, and the via for power and the via for a ground may be identical to each other. The wiring vias 113a and 113b may be completely filled with a metal or may be a via in which a metal is formed along a wall surface of a connection via hole. Each of the wiring vias 113a and 113b may also be a filled-type via filled with a metal, or a conformal-type via in which a metal is formed along a wall surface of a via hole. Moreover, the connection via 143 may have a tapered cross-sectional shape. The connection via 143 may also be formed by a plating process, and may include a seed layer and a plating layer.

When a hole for the first wiring via 113a is formed, some pads of the first wiring layer 112a may serve as a stopper. Accordingly, it is advantageous in terms of process that a first wiring via 113a has a tapered shape in which an upper side has a width larger than a width of a lower side. In this case, the first wiring via 113a may be integrated with a pad pattern of the second wiring layer 112b. Similarly, when a hole for the second wiring via 113b is formed, some pad of the second wiring layer 112b may serve as a stopper. Accordingly, it is advantageous in process that a second wiring via 113b has a tapered shape in which an upper side has a width larger than a width of a lower side. In this case, the second wiring via 113b may be integrated with a pad pattern of the third wiring layer 112c.

The other descriptions, for example, descriptions of the shielding structure 180 are substantially the same as the above descriptions, and will be omitted herein.

Figure 15:
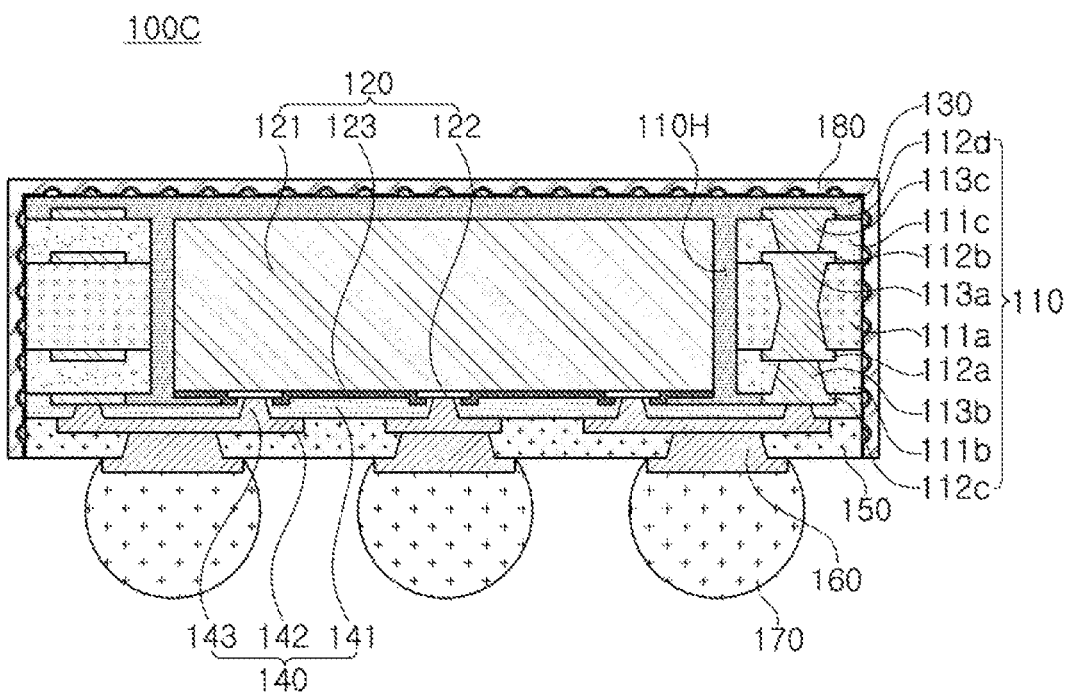
FIG. 15 is a schematic cross-sectional view illustrating a further example of a semiconductor package.

FIG. 15 is a schematic cross-sectional view illustrating another example of a semiconductor package.

Referring to FIG. 15, a semiconductor package 100C according to another example includes a frame 110 including a first insulating layer 111a, a first wiring layer 112a and a second wiring layer 112b respectively disposed on opposing surfaces of the first insulating layer 111a, a second insulating layer 111b disposed on the first insulating layer 111a to cover the first wiring layer 112a, a third redistribution layer 112c disposed on the second insulating layer 111b, a third insulating layer 111c disposed on the first insulating layer 111a to cover the second wiring layer 112b, and a fourth wiring layer 112d disposed on the third insulating layer 111c. The first to fourth wiring layers 112a, 112b, 112c, and 112d are electrically connected to a connection pad 122. Since the frame 110 includes a greater number of wiring layers 112a, 112b, 112c, and 112d, a connection structure 140 may be further simplified. The first to fourth wiring layers 112a, 112b, 112c, and 112d may be electrically connected to each other through first to third wiring vias 113a, 113b, and 113c respectively penetrating through the first to third insulating layers 111a, 111b, and 111c.

The first insulating layer 111a may have a thickness greater than a thickness of the second insulating layer 111b and a thickness of the third insulating layer 111c. The first insulating layer 111a may have a relatively great thickness to maintain rigidity, and the second and third insulating layers 111b and 111c may be introduced to form a greater number of wiring layers 112c and 112d. From a similar point of view, a wiring via of the first wiring via layer 113a penetrating through the first insulating layer 111a may have an average diameter and a height greater than an average diameter and a height of each of the second and third wiring via layers 113b and 113c penetrating through the second and third insulating layers 111b and 111c. The first wiring 113a may have an hourglass shape or a cylindrical shape, and the second and third wiring vias 113b and 113c may have tapered shapes of opposite directions. Each of the wiring layers 112a, 112b, 112c, and 112d may have a thickness greater than a thickness of the redistribution layer 142.

The other descriptions, for example, descriptions of the shielding structure 180 are substantially the same as the above descriptions, and will be omitted herein.

The shielding structure 180, described in the present disclosure, may be applied to various types of semiconductor packages other than the above-described semiconductor packages 100A, 100B, and 100C. For example, the shielding structure 180 may be applied to an epoxy molding compound (EMC) of a package in which semiconductor chips and various components are molded using the EMC. In addition to the semiconductor package, the shielding structure 180 may be applied to various components or substrates to provide electromagnetic interference shielding.

As described above, a semiconductor package, to which a shielding structure having improved adhesion and reliability is applied, and an electromagnetic interference shielding structure for the semiconductor package may be provided.

In the present disclosure, the terms "lower side", "lower portion", "lower surface," and the like, have been used to indicate a direction toward a mounted surface of the electronic component package in relation to cross sections shown in the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A semiconductor package comprising:
   a connection structure including one or more redistribution layers;
   a semiconductor chip disposed on the connection structure and electrically connected to the one or more redistribution layers;
   an encapsulant disposed on the connection structure and covering at least a portion of the semiconductor chip; and
   a shielding structure covering at least a portion of the encapsulant,
   wherein the shielding structure comprises:
      a conductive pattern layer having a plurality of openings;
      a first metal layer covering the conductive pattern layer and extending across the plurality of openings; and
      a second metal layer covering the first metal layer, and
   wherein the second metal layer has a thickness greater than a thickness of the first metal layer and wherein the first metal layer conforms to the conductive pattern layer and the plurality of openings.

2. The semiconductor package of claim 1, wherein the conductive pattern layer includes metal nanoparticles and an adhesive resin.

3. The semiconductor package of claim 2, wherein the conductive pattern layer has a conductive mesh structure.

4. The semiconductor package of claim 1, wherein the first metal layer has a concave shape in each of the plurality of openings.

5. The semiconductor package of claim 4, wherein the concave shape of the first metal layer is filled with the second metal layer.

6. The semiconductor package of claim 5, wherein the first metal layer is an electroless plating layer, and
the second metal layer is an electrolytic plating layer.

7. The semiconductor package of claim 1, wherein the shielding structure covers a top surface of the encapsulant, and extends to cover aside surface of the encapsulant and aside surface of the connection structure.

8. The semiconductor package of claim 7, wherein the encapsulant includes an insulating resin and an inorganic filler.

9. The semiconductor package of claim 1, further comprising:
a frame disposed on the connection structure and having a through-hole,
wherein the semiconductor chip is disposed in the through-hole, and
the encapsulant covers at least a portion of the frame and fills at least a portion of the through-hole.

10. The semiconductor package of claim 9, wherein the shielding structure covers a top surface of the encapsulant, and extends to cover side surfaces of the encapsulant, the frame, and the connection structure.

11. The semiconductor package of claim 10, wherein the frame includes an insulating layer, and
the insulating layer includes an insulating resin, an inorganic filler, and a glass fiber.

12. The semiconductor package of claim 9, wherein the frame comprises:
a first insulating layer disposed in contact with the connection structure;
a first wiring layer embedded in the first insulating layer while being in contact with the connection structure;
a second wiring layer disposed on the first insulating layer on a side opposing a side in which the first wiring layer of the first insulating layer is embedded;
a second insulating layer disposed on the first insulating layer and covering the second wiring layer; and
a third wiring layer disposed on a side of the second insulating layer opposing a side in which the second wiring layer of the second insulating layer is embedded,
wherein the first to third wiring layers are electrically connected to the connection pad.

13. The semiconductor package of claim 9, wherein the frame comprises:
a first insulating layer;
first and second wiring layers respectively disposed on opposing surfaces of the first insulating layer;
second and third insulating layers respectively disposed on the opposing surfaces of the first insulating layer and respectively covering the first and second wiring layers;
a third wiring layer disposed on a side of the second insulating layer opposing a side in which the first wiring layer is embedded in the second insulating layer; and
a fourth wiring layer disposed on a side of the third insulating layer opposing a side in which the second wiring layer is embedded in the third insulating layer,
wherein the first to fourth wiring layers are electrically connected to the connection pad.

14. A semiconductor package comprising:
a semiconductor chip having opposing first and second surfaces, the first surface having one or more connection pads disposed thereon;
an encapsulant covering at least a portion of the second surface of the semiconductor chip; and
a shielding structure disposed on the encapsulant and comprising a conductive pattern layer contacting the encapsulant and formed of an adhesive resin having metal nanoparticles dispersed therein,
wherein the conductive pattern layer has a plurality of openings exposing the encapsulant, and
wherein the shielding structure further comprises a metal layer covering the conductive pattern layer and extending across the plurality of openings.

15. The semiconductor package of claim 14, wherein the metal nanoparticles dispersed in the conductive pattern layer include silver, a silver-copper alloy, or a silver-palladium alloy.

16. The semiconductor package of claim 14, wherein the metal layer comprises a first metal layer covering the conductive pattern layer, and a second metal layer covering the first metal layer and having a thickness greater than a thickness of the first metal layer.

17. The semiconductor package of claim 14, wherein the conductive pattern layer has a variable thickness on the encapsulant.

18. The semiconductor package of claim 14, wherein the shielding structure including the conductive pattern layer is disposed on a top surface of encapsulant to face the second surface of the semiconductor chip, and on side surfaces of the encapsulant connected to the top surface.

* * * * *